United States Patent
Mokalla (10) Patent No.: US 9,893,722 B2
(45) Date of Patent: Feb. 13, 2018

(54) RADIO FREQUENCY SWITCHING CIRCUITRY WITH IMPROVED SWITCHING SPEED

(71) Applicant: Qorvo US, Inc., Greensboro, NC (US)

(72) Inventor: Mehra Mokalla, Santa Clara, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/244,174

(22) Filed: Aug. 23, 2016

(65) Prior Publication Data

US 2017/0302259 A1     Oct. 19, 2017

Related U.S. Application Data

(60) Provisional application No. 62/321,813, filed on Apr. 13, 2016.

(51) Int. Cl.
| | | |
|---|---|---|
| H03K 17/04 | (2006.01) | |
| H03K 17/041 | (2006.01) | |
| H03K 19/21 | (2006.01) | |
| H03K 5/1534 | (2006.01) | |

(52) U.S. Cl.
CPC ..... *H03K 17/04106* (2013.01); *H03K 5/1534* (2013.01); *H03K 19/21* (2013.01)

(58) Field of Classification Search
None
See application file for complete search history.

(56) References Cited

U.S. PATENT DOCUMENTS

| | | | | |
|---|---|---|---|---|
| 8,334,718 | B2* | 12/2012 | Granger-Jones | H03H 11/245 327/308 |
| 9,209,784 | B2* | 12/2015 | Iversen | H03H 21/0007 |
| 9,584,097 | B2* | 2/2017 | Bakalski | H03J 5/244 |
| 2010/0002345 | A1* | 1/2010 | Young | H01L 27/0255 361/56 |
| 2011/0260774 | A1* | 10/2011 | Granger-Jones | H03K 17/102 327/427 |

(Continued)

OTHER PUBLICATIONS

Chen, C. L. et al., "Fully Depleted SOI RF Switch with Dynamic Biasing," 2007 IEEE Radio Frequency Integrated Circuits Symposium, Jun. 3-5, 2007, IEEE, pp. 175-178.

(Continued)

*Primary Examiner* — Cassandra Cox
(74) *Attorney, Agent, or Firm* — Withrow & Terranova, P.L.L.C.

(57) ABSTRACT

RF switching circuitry includes one or more RF switching elements, a control signal input node, a common resistor, and common resistor bypass circuitry. The one or more RF switching elements are coupled in series between a switch input node and a switch output node. A state of each one of the one or more switching elements is determined based on a control signal. The control signal input node is configured to receive the control signal. The common resistor is coupled between the control signal input node and the one or more RF switching elements. The common resistor bypass circuitry is configured to receive the switching control signal and bypass the common resistor for a predetermined time period following one or more of a leading edge of the switching control signal and a falling edge of the switching control signal.

20 Claims, 6 Drawing Sheets

(56) References Cited

U.S. PATENT DOCUMENTS

| | | | |
|---|---|---|---|
| 2015/0116023 A1* | 4/2015 | Keane | H03K 17/6872 327/374 |
| 2015/0137246 A1* | 5/2015 | Shapiro | H01L 27/027 257/350 |
| 2015/0381171 A1* | 12/2015 | Cebi | H03K 17/687 327/427 |

OTHER PUBLICATIONS

Levy, Cooper S. et al., "A CMOS SOI Stacked Shunt Switch with Sub-500ps Time Constant and 19-Vpp Breakdown," 2013 IEEE Compound Semiconductor Integrated Circuit Symposium (CSICS), Oct. 13-16, 2013, IEEE, 4 pages.

* cited by examiner

RADIO FREQUENCY SWITCHING CIRCUITRY WITH IMPROVED SWITCHING SPEED

RELATED APPLICATIONS

This application claims the benefit of provisional patent application Ser. No. 62/321,813, filed Apr. 13, 2016, the disclosure of which is hereby incorporated herein by reference in its entirety.

FIELD OF THE DISCLOSURE

The present disclosure relates to radio frequency (RF) switching circuitry, and in particular to RF switching circuitry designed for increased switching speed.

BACKGROUND

Radio frequency (RF) switching circuitry is used throughout modern wireless communications devices. For example, RF switching circuitry may be used in antenna tuning circuitry, RF front end switching circuitry (e.g., antenna swapping switching circuitry, signal routing circuitry), and the like. Generally, RF switching circuitry may be used to route RF signals between one or more components and one or more antennas. Further, RF switching circuitry may be used to present a desired impedance or voltage to a particular node. Conventionally, the design of RF switching circuitry has been focused on providing adequate power handling capability with minimal insertion loss and non-linearity. As wireless communications standards continue to evolve, switching speed has become a primary design concern in addition to insertion loss, power handling capability, and linearity.

Figure 1:
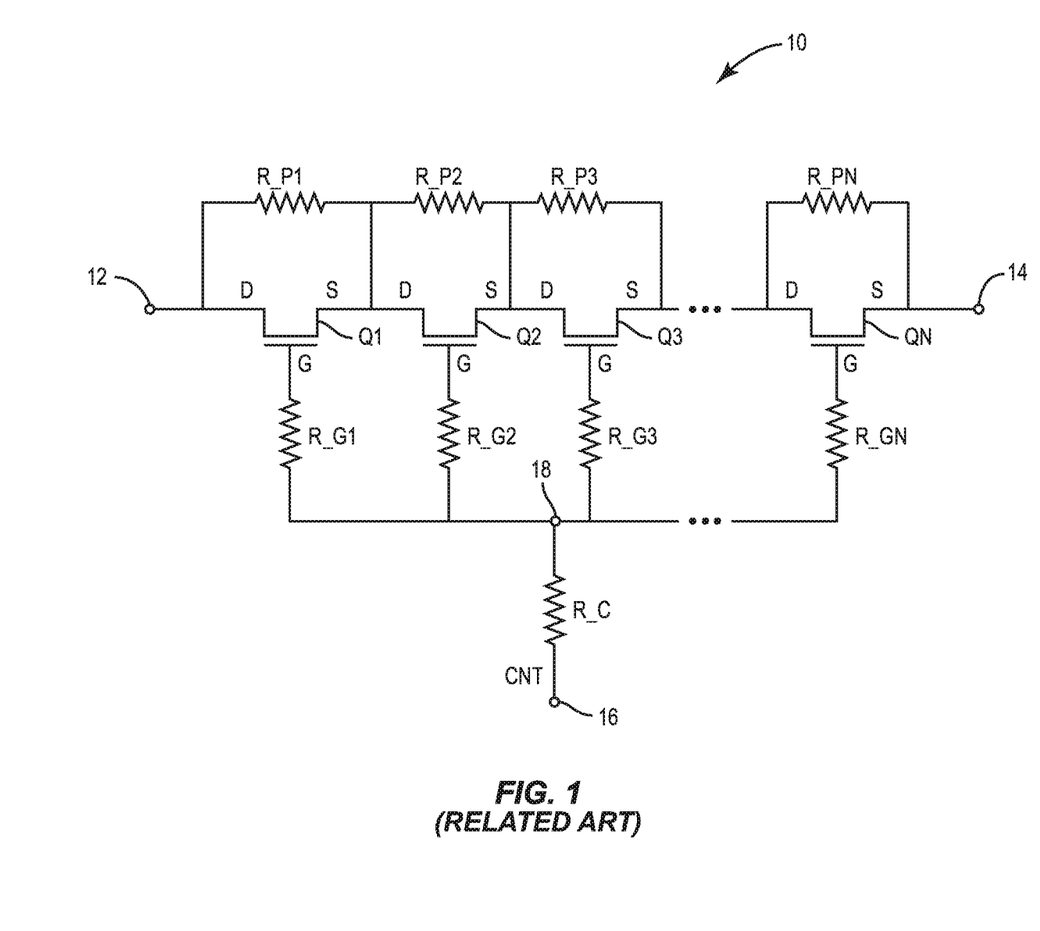
FIG. 1 is a functional schematic illustrating conventional RF switching circuitry.

FIG. 1 is a functional schematic illustrating conventional RF switching circuitry 10. The conventional RF switching circuitry 10 includes a switch input node 12, a switch output node 14, and a control signal input node 16. A number of RF switching elements Q1-QN are coupled in series between the switch input node 12 and the switch output node 14. As shown in FIG. 1, each one of the RF switching elements Q1-QN is a field-effect transistor (FET) including a gate contact (G), a drain contact (D), and a source contact (S). A drain contact (D) of a first one of the RF switching elements Q1 is coupled to the switch input node 12, a source contact (S) of a last one of the RF switching elements QN is coupled to the switch output node 14, and the remaining RF switching elements Q1-QN are coupled drain contact (D) to source contact (S) as illustrated.

A number of parallel resistors R_P1-R_PN are each coupled between a drain contact (D) and a source contact (S) of a different one of the RF switching elements Q1-QN. Specifically, a first parallel resistor R_P1 is coupled between the drain contact (D) and the source contact (S) of the first one of the RF switching elements Q1, a second parallel resistor R_P2 is coupled between the drain contact (D) and the source contact (S) of a second one of the RF switching elements Q2, a third parallel resistor R_P3 is coupled between the drain contact (D) and the source contact (S) of a third one of the RF switching elements Q3, and a last parallel resistor R_PN is coupled between the drain contact (D) and the source contact (S) of the last one of the RF switching elements QN.

A number of gate resistors R_G1-R_GN are each coupled between a gate contact (G) of a different one of the RF switching elements Q1-QN and a common node 18. Specifically, a first gate resistor R_G1 is coupled between the gate contact (G) of the first one of the RF switching elements Q1 and the common node 18, a second gate resistor R_G2 is coupled between the gate contact (G) of the second one of the RF switching elements Q2 and the common node 18, a third gate resistor R_G3 is coupled between the gate contact (G) of the third one of the RF switching elements Q3 and the common node 18, and a last gate resistor R_GN is coupled between the last one of the RF switching elements QN and the common node 18. A common resistor R_C is coupled between the control signal input node 16 and the common node 18.

The RF switching elements Q1-QN may be enhancement type FETs, and accordingly may present a very high impedance when a control signal CNT that does not exceed a threshold voltage of each one of the RF switching elements Q1-QN at the gate contacts (G) thereof is provided. In other words, the RF switching elements Q1-QN may provide an open circuit (i.e., off state) in response to an inadequate control signal CNT. When an adequate control signal CNT is provided to the control signal input node 16, it passes through the common resistor R_C, and is distributed by the gate resistors R_G1-R_GN to the gate contact (G) of each one of the RF switching elements Q1-QN. This causes the RF switching elements Q1-QN to present a very low impedance, thereby connecting the switch input node 12 to the switch output node 14. In other words, the RF switching elements Q1-QN may provide a closed circuit (i.e., on state) in response to an adequate control signal CNT.

As will be appreciated by those skilled in the art, capacitances between the gate contact (G) and the drain contact (D) (i.e., gate-to-drain capacitance) and the gate contact (G) and the source contact (S) (i.e., gate-to-source capacitance) of each one of the RF switching elements Q1-QN may allow a small amount of current from RF signals passing through the conventional RF switching circuitry 10 to flow into the gate resistors R_G1-R_GN and the common resistor R_C. This leakage current is dissipated by the gate resistors R_G1-R_GN and the common resistor R_C, thereby resulting in resistive losses that reduce the quality of the RF signals passed through the conventional RF switching circuitry 10. As the power handling requirements of the conventional RF switching circuitry 10 increase, it may be necessary to add additional RF switching elements to avoid breakdown. These additional RF switching elements may add insertion loss, which is compensated for by increasing the size of the RF switching elements. However, larger RF switching elements also provide larger gate-to-drain and gate-to-source capacitances, which increase the leakage current and thus resistive losses discussed above. Conventionally, these leakage currents have been reduced by maximizing the total resistance of the gate resistors R_G1-R_GN and the common resistor R_C.

Maximizing the total resistance of the gate resistors R_G1-R_GN and the common resistor R_C often reduces the switching speed of the conventional RF switching circuitry 10. As will be appreciated by those skilled in the art, the switching time of the conventional RF switching circuitry 10 is proportional to the time constant $\tau=RC$ thereof. Accordingly, as the total resistance of the gate resistors R_G1-R_GN and the common resistor R_C increases, so does the switching time of the conventional RF switching circuitry. A balance must therefore be struck between reducing resistive losses by preventing current flow in the control signal path and minimizing the switching time of the conventional RF switching circuitry 10. Such balancing often results in sub-optimal RF switching circuitry, especially when considering the constraints of modern wireless communications devices that require faster and faster switching times to comply with evolving wireless communications standards.

Accordingly, there is a need for improved RF switching circuitry with reduced switching times and insertion loss.

SUMMARY

The present disclosure relates to radio frequency (RF) switching circuitry, and in particular to RF switching circuitry designed for increased switching speed. In one embodiment, RF switching circuitry includes one or more RF switching elements, a control signal input node, a common resistor, and common resistor bypass circuitry. The one or more RF switching elements are coupled in series between a switch input node and a switch output node. A state of each one of the one or more switching elements is determined based on a control signal. The control signal input node is configured to receive the control signal. The common resistor is coupled between the control signal input node and the one or more RF switching elements. The common resistor bypass circuitry is configured to receive the switching control signal and bypass the common resistor for a predetermined time period following one or more of a leading edge of the switching control signal and a falling edge of the switching control signal. By temporarily bypassing the common resistor during a switching transition of the RF switching circuitry, the switching time of the RF switching circuitry may be reduced without reducing other performance parameters of the RF switching circuitry such as insertion loss and leakage current.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
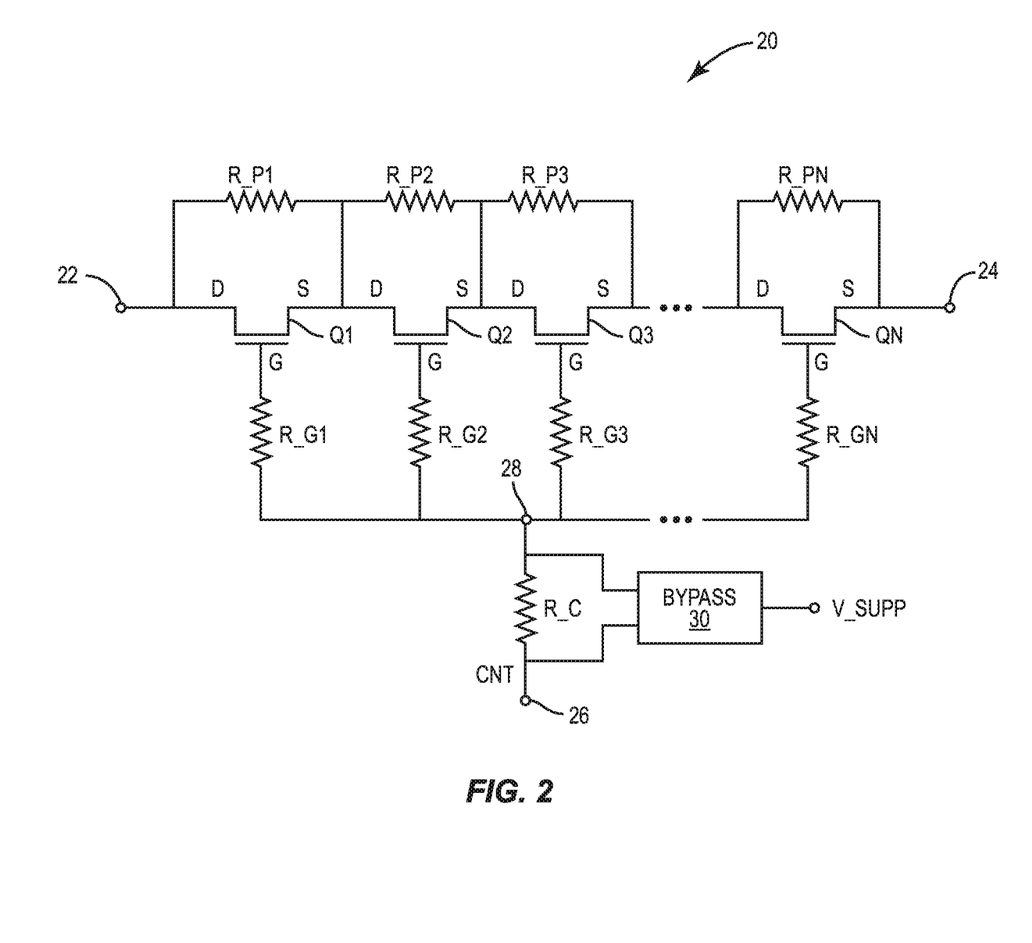
FIG. 2 is a functional schematic illustrating RF switching circuitry according to one embodiment of the present disclosure.

FIG. 2 is a functional schematic of radio frequency (RF) switching circuitry 20 according to one embodiment of the present disclosure. The RF switching circuitry 20 includes a switch input node 22, a switch output node 24, and a control signal input node 26. A number of RF switching elements Q1-QN are coupled in series between the switch input node 22 and the switch output node 24. As shown in FIG. 2, each one of the RF switching elements Q1-QN is a field-effect transistor (FET) including a gate contact (G), a drain contact (D), and a source contact (S). A drain contact (D) of a first one of the RF switching elements Q1 is coupled to the switch input node 22, a source contact (S) of a last one of the RF switching elements QN is coupled to the switch output node 24, and the remaining RF switching elements Q1-QN are coupled drain contact (D) to source contact (S) as illustrated.

A number of parallel resistors R_P1-R_PN are each coupled between a drain contact (D) and a source contact (S) of a different one of the RF switching elements Q1-QN. Specifically, a first parallel resistor R_P1 is coupled between the drain contact (D) and the source contact (S) of the first one of the RF switching elements Q1, a second parallel resistor R_P2 is coupled between the drain contact (D) and the source contact (S) of a second one of the RF switching elements Q2, a third parallel resistor R_P3 is coupled between the drain contact (D) and the source contact (S) of a third one of the RF switching elements Q3, and a last parallel resistor R_PN is coupled between the drain contact (D) and the source contact (S) of the last one of the RF switching elements QN.

A number of gate resistors R_G1-R_GN are each coupled between a gate contact (G) of a different one of the RF switching elements Q1-QN and a common node 28. Specifically, a first gate resistor R_G1 is coupled between the gate contact (G) of the first one of the RF switching elements Q1 and the common node 28, a second gate resistor R_G2 is coupled between the gate contact (G) of the second one of the RF switching elements Q2 and the common node 28, a third gate resistor R_G3 is coupled between the gate contact (G) of the third one of the RF switching elements Q3 and the common node 28, and a last gate resistor R_GN is coupled between the last one of the RF switching elements QN and the common node 28. A common resistor R_C is coupled between the control signal input node 26 and the common node 28.

The RF switching elements Q1-QN may be enhancement type FETs, and accordingly may present a very high impedance when a control signal CNT that does not exceed a threshold voltage of each one of the RF switching elements Q1-QN at the gate contacts (G) thereof is provided. In other words, the RF switching elements Q1-QN may provide an open circuit (i.e., off state) in response to an inadequate control voltage CNT. When an adequate control signal CNT is provided to the control signal input node 26, it passes through the common resistor R_C, and is distributed by the gate resistors R_G1-R_GN to the gate contact (G) of each one of the RF switching elements Q1-QN. This causes the RF switching elements Q1-QN to present a very low impedance, thereby connecting the switch input node 22 to the switch output node 24. In other words, the RF switching elements Q1-QN may provide a closed circuit (i.e., on state) in response to an adequate control signal CNT.

As discussed above, it is often necessary to balance the design constraints associated with reducing resistive losses due to leakage current with minimizing the switching time of the RF switching circuitry 20. To address these issues, common resistor bypass circuitry 30 is coupled to the control signal input node 26 and the common node 28. The common resistor bypass circuitry 30 may receive the control signal CNT and a supply voltage V_SUPP and selectively bypass the common resistor R_C for a predetermined period of time after a leading edge of the control signal CNT and a falling edge of the control signal CNT, as discussed below. In other words, the common resistor bypass circuitry 30 may selectively provide a low impedance path around the common resistor R_C when the RF switching circuitry 20 is being turned on and turned off. Bypassing the common resistor R_C during turn on and turn off of the RF switching circuitry 20 lowers the total effective resistance of the gate resistors R_G1-R_GN and the common resistor R_C, which effectively reduces the time constant of the RF switching circuitry 20 and therefore the switching time. While the leakage current may temporarily increase when the common resistor R_C is bypassed, such an increase in leakage current is generally inconsequential, as it only occurs during transitions of the RF switching circuitry 20. Accordingly, the switching time of the RF switching circuitry 20 is decreased without compromising the performance thereof.

The RF switching circuitry 20 may be used to accomplish any number of tasks in a larger RF circuit. For example, the RF switching circuitry 20 may be series switching circuitry configured to selectively pass RF signals from the switch input node 22 to the switch output node 24. The RF switching circuitry 20 may also be shunt switching circuitry configured to selectively connect the switch input node to a fixed voltage (e.g., ground) or a desired impedance.

Figure 3:
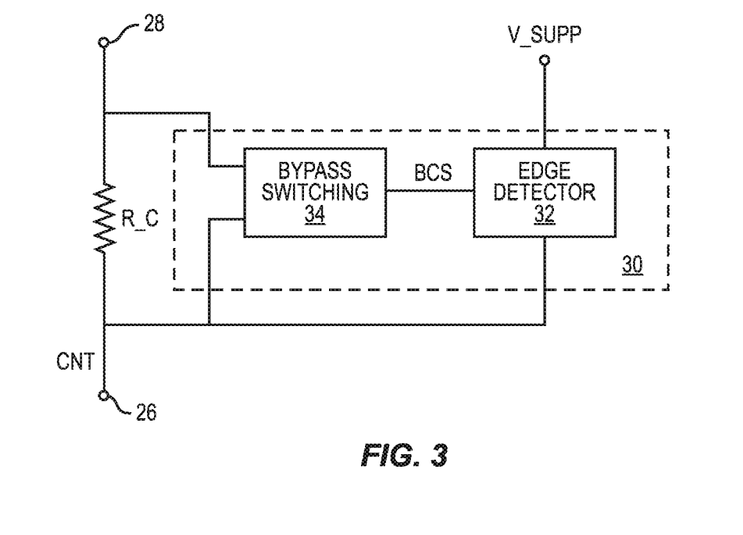
FIG. 3 is a functional schematic illustrating common resistor bypass circuitry for use in RF switching circuitry according to one embodiment of the present disclosure.

FIG. 3 shows details of the common resistor bypass circuitry 30 according to one embodiment of the present disclosure. The common resistor bypass circuitry 30 includes edge detector circuitry 32 and bypass switching circuitry 34. The edge detector circuitry 32 is coupled between the control signal input node 26 and the bypass switching circuitry 34, and is configured to receive the control signal CNT and the supply voltage V_SUPP and provide a bypass control signal BCS to the bypass switching circuitry 34. The bypass switching circuitry 34 is coupled between the edge detector circuitry 32, the control signal input node 26, and the common node 28, and is configured to provide a low impedance path around the common resistor R_C based on the bypass control signal BCS. For example, if the bypass control signal BCS is high, the bypass switching circuitry 34 may provide a low impedance path around the common resistor R_C.

The edge detector circuitry 32 may be any suitable edge detector circuitry. Those skilled in the art will appreciate that many different edge detectors may be used to detect the leading edge and/or falling edge of the control signal CNT, all of which are contemplated herein. Further, the bypass switching circuitry 34 may be any suitable switching circuitry capable of providing a low impedance path around the common resistor R_C in response to the bypass control signal BCS. While the edge detector circuitry 32 and the bypass switching circuitry 34 are shown as discrete parts of the common resistor bypass circuitry 30, one or more of the edge detector circuitry 32 and the bypass switching circuitry 34 may comprise multiple parts, or may be combined into a single part without departing from the principles of the present disclosure.

Figure 4:
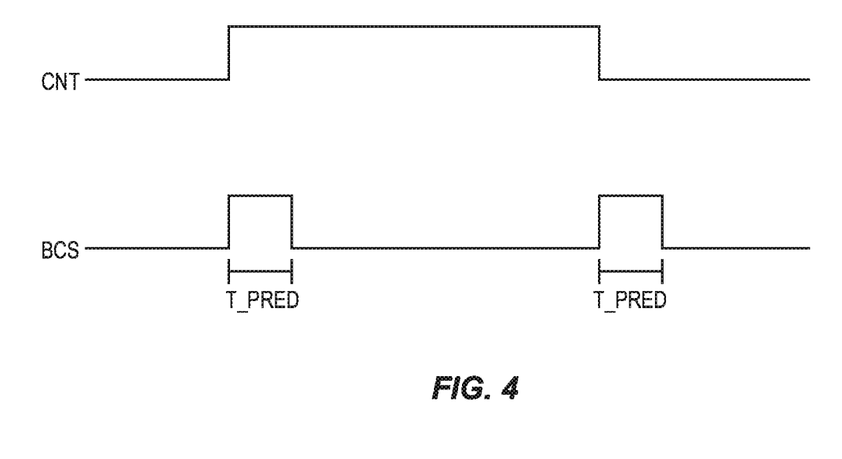
FIG. 4 is a diagram illustrating operation of RF switching circuitry according to one embodiment of the present disclosure.

FIG. 4 is a diagram illustrating the operation of the RF switching circuitry 20 according to one embodiment of the present disclosure. As shown in FIG. 3, the control signal CNT may provide a pulse at some point in time, which is configured to turn on the RF switching circuitry 20 as discussed above. Normally, the total effective resistance of the gate resistors R_G1-R_GN and the common resistor R_C would slow the switching time of the RF switching circuitry 20 due to the increased time constant associated with the high resistance thereof. However, the bypass control signal BCS provides a pulse after each one of the leading edge of the control signal and the falling edge of the control signal, which causes the bypass switching circuitry 34 to provide a low impedance path around the common resistor R_C. Accordingly, the total effective resistance of the gate resistors R_G1-R_GN and the common resistor R_C is substantially reduced (by the amount of the common resistor R_C), and the switching time of the RF switching circuitry 20 is temporarily decreased. As discussed above, the temporary increase in switching speed has little impact on other performance parameters of the RF switching circuitry such as insertion loss and leakage current. The edge detector circuitry 32 may provide the bypass control signal BCS such that the common resistor R_C is bypassed for a predetermined amount of time T_PRED. This time may be adjusted as desired to provide the best switching time without degrading other performance parameters of the RF switching circuitry. In one embodiment, the predetermined amount of time T_PRED for which the common resistor R_C is bypassed after a leading edge and a falling edge of the control signal CNT is between about 100 picoseconds and 50 nanoseconds.

Figure 5:
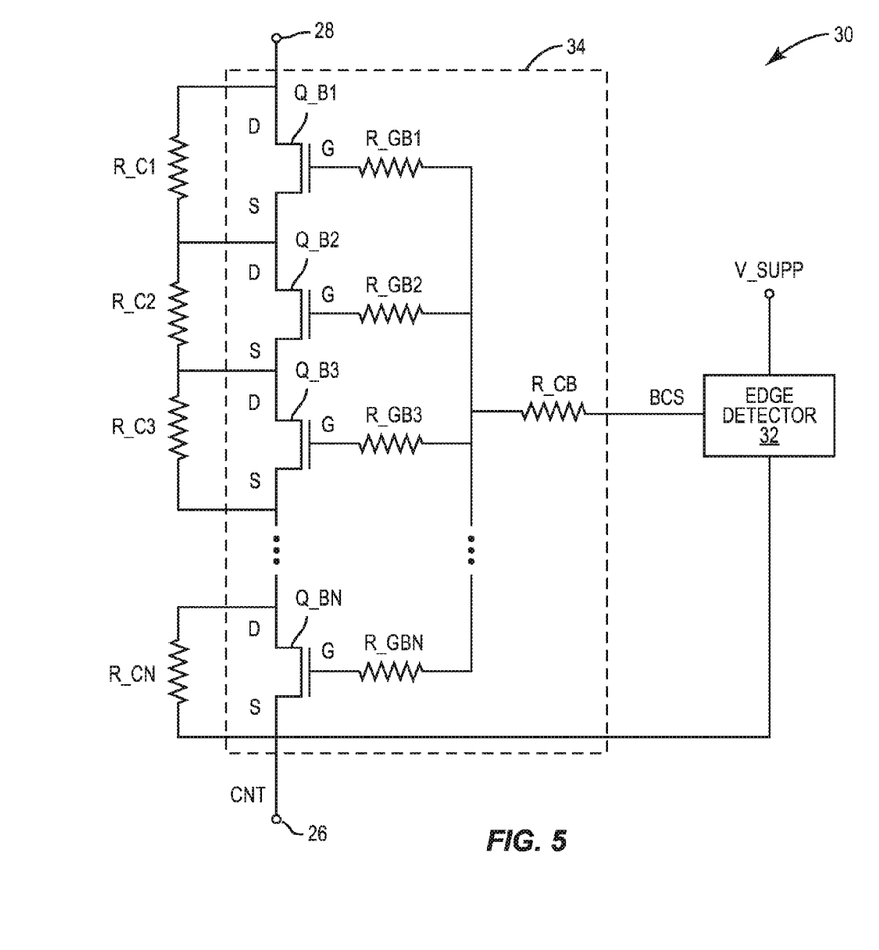
FIG. 5 is a functional schematic illustrating common resistor bypass circuitry for use in RF switching circuitry according to one embodiment of the present disclosure.

FIG. 5 is a functional schematic illustrating details of the common resistor bypass circuitry 30 according to one embodiment of the present disclosure. In particular, FIG. 5 shows details of the bypass switching circuitry 34. The bypass switching circuitry 34 includes a number of bypass switching elements Q_B1-Q_BN coupled in series between the common node 28 and the control signal input node 26. Each one of the bypass switching elements Q_B1-Q_BN is a FET with a gate contact (G), a drain contact (D), and a source contact (S). A drain contact (D) of a first one of the bypass switching elements Q_B1 is coupled to the common node 28, a source contact (S) of a last one of the bypass switching elements Q_BN is coupled to the control signal input node 26, and the remaining bypass switching elements Q_B2-Q_B3 are coupled drain contact (D) to source contact (S) as illustrated.

A number of gate bypass resistors R_GB1-R_GBN are coupled between a gate contact (G) of a different one of the bypass switching elements Q_B1-Q_BN and a common bypass resistor R_CB. Specifically, a first gate bypass resistor R_GB1 is coupled between the gate contact (G) of the first one of the bypass switching elements Q_B1 and the common bypass resistor R_CB, a second gate bypass resistor R_GB2 is coupled between the gate contact (G) of a second one of the bypass switching elements Q_B2 and the common bypass resistor R_CB, a third gate bypass resistor R_GB3 is coupled between the gate contact (G) of a third one of the bypass switching elements Q_B3 and the common bypass resistor R_CB, and a last gate bypass resistor R_GBN is coupled between the gate contact (G) of the last one of the bypass switching elements Q_BN and the common bypass resistor R_CB.

The common resistor R_C is divided into multiple common resistors R_C1-R_CN, each of which is coupled between the drain contact (D) and the source contact (S) of a different one of the bypass switching elements Q_B1-Q_BN. Specifically, a first common resistor R_C1 is coupled between the drain contact (D) and the source contact (S) of the first one of the bypass switching elements Q_B1, a second common resistor R_C2 is coupled between the drain contact (D) and the source contact (S) of the second one of the bypass switching elements Q_B2, a third common resistor R_C3 is coupled between the drain contact (D) and the source contact (S) of the third one of the bypass switching elements Q_B3, and a last common resistor R_CN is coupled between the drain contact (D) and the source contact (S) of the last one of the bypass switching elements Q_BN.

Providing the bypass switching circuitry 34 as shown in FIG. 5 may increase the power handling capability thereof, which may be desirable in some situations. While the bypass switching circuitry 34 requires multiple bypass switching elements Q_B1-Q_BN, the performance requirements of these switching elements are relatively relaxed due to the fact that they are only passing control signals. For example, the on-state resistance of the multiple bypass switching elements Q_B1-Q_BN is not critical, and thus may be relatively high when compared to the RF switching elements Q1-QN. Accordingly, these switching elements may remain small and thus consume minimal area in the common resistor bypass circuitry 30 while providing adequate power handling capability.

Notably, the bypass switching circuitry 34 shown in FIG. 5 is only exemplary. Those skilled in the art will appreciate that there are any number of different ways to implement the bypass switching circuitry 34 to accomplish the aforementioned objectives, all of which are contemplated herein.

Figure 6:
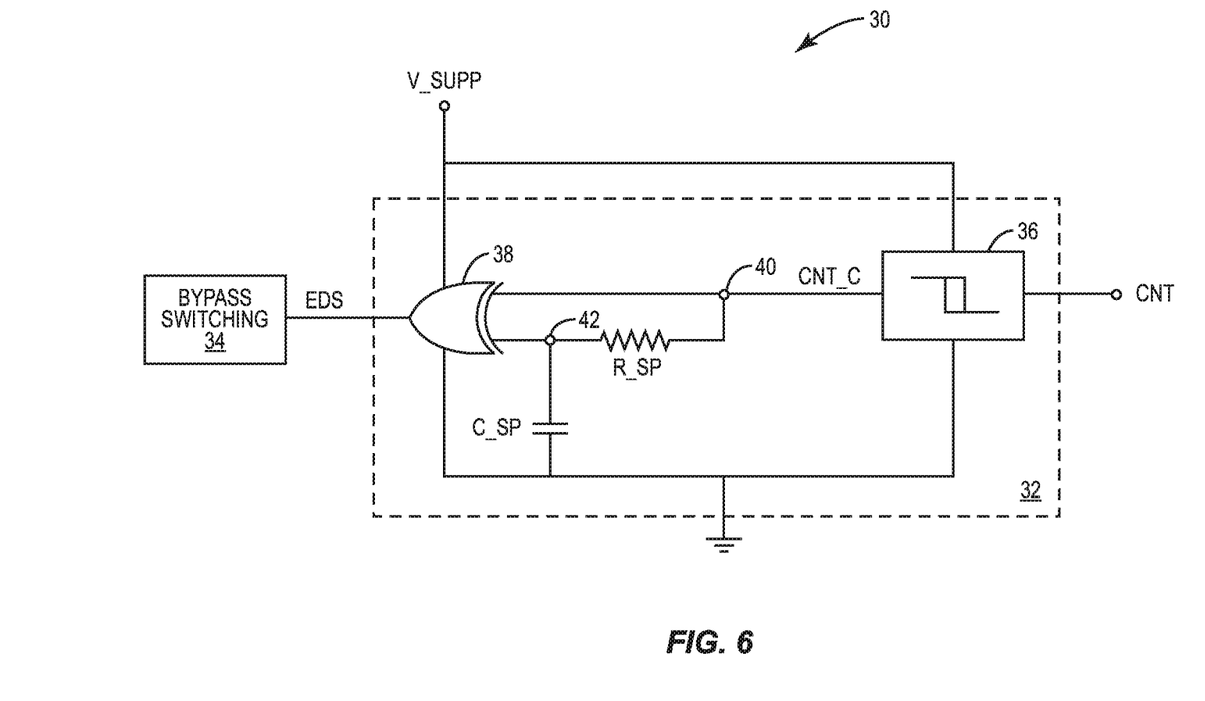
FIG. 6 is a functional schematic illustrating common resistor bypass circuitry for use in RF switching circuitry according to one embodiment of the present disclosure.

FIG. 6 is a functional schematic illustrating details of the common resistor bypass circuitry 30 according to one embodiment of the present disclosure. In particular, FIG. 6 shows details of the edge detector circuitry 32. The edge detector circuitry 32 includes a Schmitt trigger 36, an exclusive-or (X-OR) logic gate 38, a signal processing resistor R_SP, and a signal processing capacitor C_SP. A first X-OR input node 40 is coupled to an output of the Schmitt trigger 36. A second X-OR input node 42 is coupled to the first X-OR input node 40 via the signal processing resistor R_SP. The signal processing capacitor C_SP is coupled between the second X-OR input node 42 and ground.

In operation, the Schmitt trigger 36 is configured to receive the control signal CNT and provide a conditioned control signal CNT_C. The conditioned control signal CNT_C is a duplicate of the control signal CNT with reduced glitching and fast rise and fall times. An edge detection signal EDS is generated by the X-OR logic gate 38 in response to a conditioned control signal CNT_C from the Schmitt trigger 36 provided at the first X-OR input node 40. Assuming that the conditioned control signal CNT_C is a pulse as shown above in FIG. 4, the first X-OR input node 40 will reach the potential of the pulse sooner than the second X-OR input node 42 due to the time needed for the signal processing capacitor C_SP to charge through the signal processing resistor R_SP. The charge time of the signal processing capacitor C_SP defines a delay proportional to the values of the signal processing resistor R_SP and the signal processing capacitor C_SP. This delay is the amount of time between the first X-OR input node 40 asserting high and the second X-OR input node 42 asserting high. When the first X-OR input node 40 asserts high and the second X-OR input node 42 is still low, the output of the X-OR logic gate 38 output will assert high. Once the signal processing capacitor C_SP is charged such that both the first X-OR input node 40 and the second X-OR input node 42 both assert high, the output of the X-OR logic gate 38 asserts low, thereby creating a rising edge detection pulse with a pulse width defined by the delay discussed above.

When a falling edge of the conditioned control signal CNT_C reaches the first X-OR input node 40, this node is immediately asserted low. However, the second X-OR input node 42 remains high because the signal processing capacitor C_SP must discharge through the signal processing resistor R_SP. Such discharging occurs within a time period proportional to the values of the signal processing resistor R_SP and the signal processing capacitor C_SP, and defines the delay discussed above. Until the signal processing capacitor C_SP is discharged below a threshold indicating a low signal, the output of the X-OR logic gate 38 continues to assert high, thereby creating a falling edge detection pulse with a pulse width defined by the delay discussed above. When the signal processing capacitor C_SP is discharged below a threshold indicating a low signal such that both the first X-OR input node 40 and the second X-OR input node 42 are both low, the output of the X-OR logic gate 38 asserts low.

Notably, the edge detector circuitry 32 shown in FIG. 6 is only exemplary. Those skilled in the art will appreciate that there are any number of ways to implement the edge detector circuitry 32 to accomplish the aforementioned objectives, all of which are contemplated herein.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) switching circuitry comprising:
   one or more RF switching elements coupled in series between a switch input node and a switch output node, wherein a state of the one or more RF switching elements is determined based on a control signal;
   a control signal input node configured to receive the control signal;
   a common resistor coupled between the control signal input node and the one or more RF switching elements; and
   common resistor bypass circuitry configured to receive the control signal and bypass the common resistor for a predetermined time period following one or more of a leading edge of the control signal and a falling edge of the control signal.

2. The RF switching circuitry of claim 1 wherein:
   the one or more RF switching elements comprise a plurality of RF switching field-effect transistors (FETs) each having a gate contact, a drain contact, and a source contact; and
   a drain contact of a first one of the plurality of RF switching FETs is coupled to the switch input node, a source contact of a last one of the plurality of RF switching FETs is coupled to the switch output node, and adjacent ones of the plurality of RF switching FETs are coupled drain contact to source contact.

3. The RF switching circuitry of claim 2 further comprising:
   a plurality of parallel resistors, each coupled between a drain contact and a source contact of a different one of the plurality of RF switching FETs; and
   a plurality of gate resistors, each coupled between a gate of a different one of the plurality of RF switching FETs and a common node.

4. The RF switching circuitry of claim 3 wherein the common resistor is coupled between the control signal input node and the common node.

5. The RF switching circuitry of claim 4 wherein the common resistor bypass circuitry is configured to:
   receive the control signal;
   detect a leading edge of the control signal;
   provide a low impedance path around the common resistor for the predetermined time period after detection of the leading edge of the control signal;
   detect a falling edge of the control signal; and
   provide a low impedance path around the common resistor for the predetermined time period after detection of the falling edge of the control signal.

6. The RF switching circuitry of claim 5 wherein the predetermined time period is between 100 picoseconds and 50 nanoseconds.

7. The RF switching circuitry of claim 5 wherein the common resistor bypass circuitry comprises:
   edge detector circuitry configured to receive the control signal and provide a bypass control signal indicating the detection of the leading edge of the control signal and the falling edge of the control signal; and
   bypass switching circuitry configured to provide a low impedance path around the common resistor in response to the bypass control signal.

8. The RF switching circuitry of claim 7 wherein the bypass switching circuitry comprises at least one bypass FET having a gate contact coupled to an output of the edge detector circuitry such that a state of the at least one bypass FET is determined based on the bypass control signal, a source contact coupled to the control signal input node, and a drain contact coupled to the common node.

9. The RF switching circuitry of claim 7 wherein:
   the bypass switching circuitry comprises a plurality of bypass FETs each comprising a gate contact coupled to an output of the edge detector circuitry such that a state of the plurality of bypass FETs is determined based on the bypass control signal, a drain contact, and a source contact;
   a drain contact of a first one of the plurality of bypass FETs is coupled to the common node, a source contact of a last one of the plurality of bypass FETs is coupled to the control signal input node, and adjacent ones of the plurality of bypass FETs are coupled drain contact to source contact; and
   the common resistor comprises a plurality of common resistors each coupled between a drain contact and a source contact of a different one of the plurality of bypass FETs.

10. The RF switching circuitry of claim 7 wherein the RF switching circuitry is series RF switching circuitry configured to selectively pass an RF signal provided at the switch input node to the switch output node based on the control signal.

11. The RF switching circuitry of claim 7 wherein the RF switching circuitry is shunt RF switching circuitry configured to selectively couple the switch input node to ground based on the control signal.

12. The RF switching circuitry of claim 7 wherein the predetermined period of time is between 100 picoseconds and 50 nanoseconds.

13. The RF switching circuitry of claim 1 wherein the common resistor bypass circuitry is configured to:
   receive the control signal;
   detect a leading edge of the control signal;
   provide a low impedance path around the common resistor for the predetermined time period after detection of the leading edge of the control signal;
   detect a falling edge of the control signal; and
   provide a low impedance path around the common resistor for the predetermined time period after detection of the falling edge of the control signal.

14. The RF switching circuitry of claim 13 wherein the predetermined period of time is between 100 picoseconds and 50 nanoseconds.

15. The RF switching circuitry of claim 13 wherein the common resistor bypass circuitry comprises:
   edge detector circuitry configured to receive the control signal and provide a bypass control signal indicating the detection of the leading edge of the control signal and the falling edge of the control signal; and
   bypass switching circuitry configured to provide a low impedance path around the common resistor in response to the bypass control signal.

16. The RF switching circuitry of claim 15 wherein the bypass switching circuitry comprises at least one bypass FET having a gate contact coupled to an output of the edge detector circuitry such that a state of the at least one bypass FET is determined based on the bypass control signal, a source contact coupled to the control signal input node, and a drain contact coupled to the common node.

17. The RF switching circuitry of claim 15 wherein:
   the bypass switching circuitry comprises a plurality of bypass FETs each comprising a gate contact coupled to an output of the edge detector circuitry such that a state of the plurality of bypass FETs is determined based on the bypass control signal, a drain contact, and a source contact;
   a drain contact of a first one of the plurality of bypass FETs is coupled to the common node, a source contact of a last one of the plurality of bypass FETs is coupled to the control signal input node, and adjacent ones of the plurality of bypass FETs are coupled drain contact to source contact; and
   the common resistor comprises a plurality of common resistors each coupled between a drain contact and a source contact of a different one of the plurality of bypass FETs.

18. The RF switching circuitry of claim 15 wherein the RF switching circuitry is series RF switching circuitry configured to selectively pass an RF signal provided at the switch input node to the switch output node based on the control signal.

19. The RF switching circuitry of claim 18 wherein the RF switching circuitry is shunt RF switching circuitry configured to selectively couple the switch input node to ground based on the control signal.

20. The RF switching circuitry of claim 1 wherein the predetermined period of time is between 100 picoseconds and 50 nanoseconds.

* * * * *